United States Patent
Grover et al.

[11] Patent Number: 6,097,272
[45] Date of Patent: Aug. 1, 2000

[54] CONTACTLESS SWITCH

[75] Inventors: Michael Grover, Maple Valley; Mark J. Suryan, Bothell, both of Wash.

[73] Assignee: Korry Electronics Co., Seattle, Wash.

[21] Appl. No.: 09/193,908

[22] Filed: Nov. 17, 1998

[51] Int. Cl.⁷ .................................................. H01H 9/00
[52] U.S. Cl. .................. 335/207; 335/205; 338/32 H; 200/526
[58] Field of Search ..................... 335/205–208, 335/228; 200/520–529; 338/32 R, 32 H

[56] References Cited

U.S. PATENT DOCUMENTS

| | | |
|---|---|---|
| 3,184,557 | 5/1965 | Clarey . |
| 3,571,774 | 3/1971 | Hubrich . |
| 3,622,922 | 11/1971 | Mogi . |
| 3,662,315 | 5/1972 | Mogi . |
| 3,679,318 | 7/1972 | Liguori . |
| 3,783,430 | 1/1974 | Nishiba et al. . |
| 3,792,931 | 2/1974 | Ganz . |
| 3,873,957 | 3/1975 | Würscher et al. . |
| 3,882,337 | 5/1975 | Pfeffer et al. . |
| 3,988,710 | 10/1976 | Sidor et al. ............................ 338/32 R |
| 4,054,860 | 10/1977 | Henderson et al. . |
| 4,054,861 | 10/1977 | Markison . |
| 4,061,988 | 12/1977 | Lewandowski . |
| 4,115,015 | 9/1978 | Torii . |
| 4,137,512 | 1/1979 | Sidor ...................................... 335/206 |
| 4,156,820 | 5/1979 | Fukuda et al. . |
| 4,227,058 | 10/1980 | Johnston et al. . |
| 4,311,981 | 1/1982 | Luzynski . |
| 4,389,627 | 6/1983 | Uesugi et al. .......................... 335/206 |
| 4,489,303 | 12/1984 | Martin . |
| 4,540,964 | 9/1985 | Bleeke . |
| 5,026,190 | 6/1991 | Longarzo . |
| 5,698,909 | 12/1997 | Miyazawa .............................. 307/116 |
| 5,861,796 | 1/1999 | Benshoff ............................... 338/32 H |

*Primary Examiner*—Lincoln Donovan
*Assistant Examiner*—Raymond Barrera
*Attorney, Agent, or Firm*—Christensen, O'Connor, Johnson & Kindness, PLLC

[57] ABSTRACT

A contactless switch (20) for actuating a system between an open circuit position and a closed circuit position is disclosed. The switch includes a housing (22) and a linear actuator (34) disposed within the housing. The switch also includes a linear-to-rotary motion assembly (30) disposed within the housing. The linear-to-rotary motion assembly is coupled to the linear actuator for producing a rotary motion of the linear-to-rotary motion assembly in response to a linear displacement of the linear-to-rotary motion assembly by the linear actuator. The switch also includes a plurality of Hall effect sensors (106) and magnets (80). The sensors are disposed within the housing and the magnets are disposed on the linear-to-rotary motion assembly. To affect the state change of the switch, the magnets are rotated into and out of close proximity with the sensors by the linear-to-rotary motion assembly when the switch is actuated by applying a force to the linear actuator that causes the linear displacements of the linear-to-rotary motion assembly. A tactile response mechanism (170) is formed with the linear-to-rotary motion assembly to produce a tactile response when the contactless switch is actuated between the open and closed circuit positions.

23 Claims, 13 Drawing Sheets

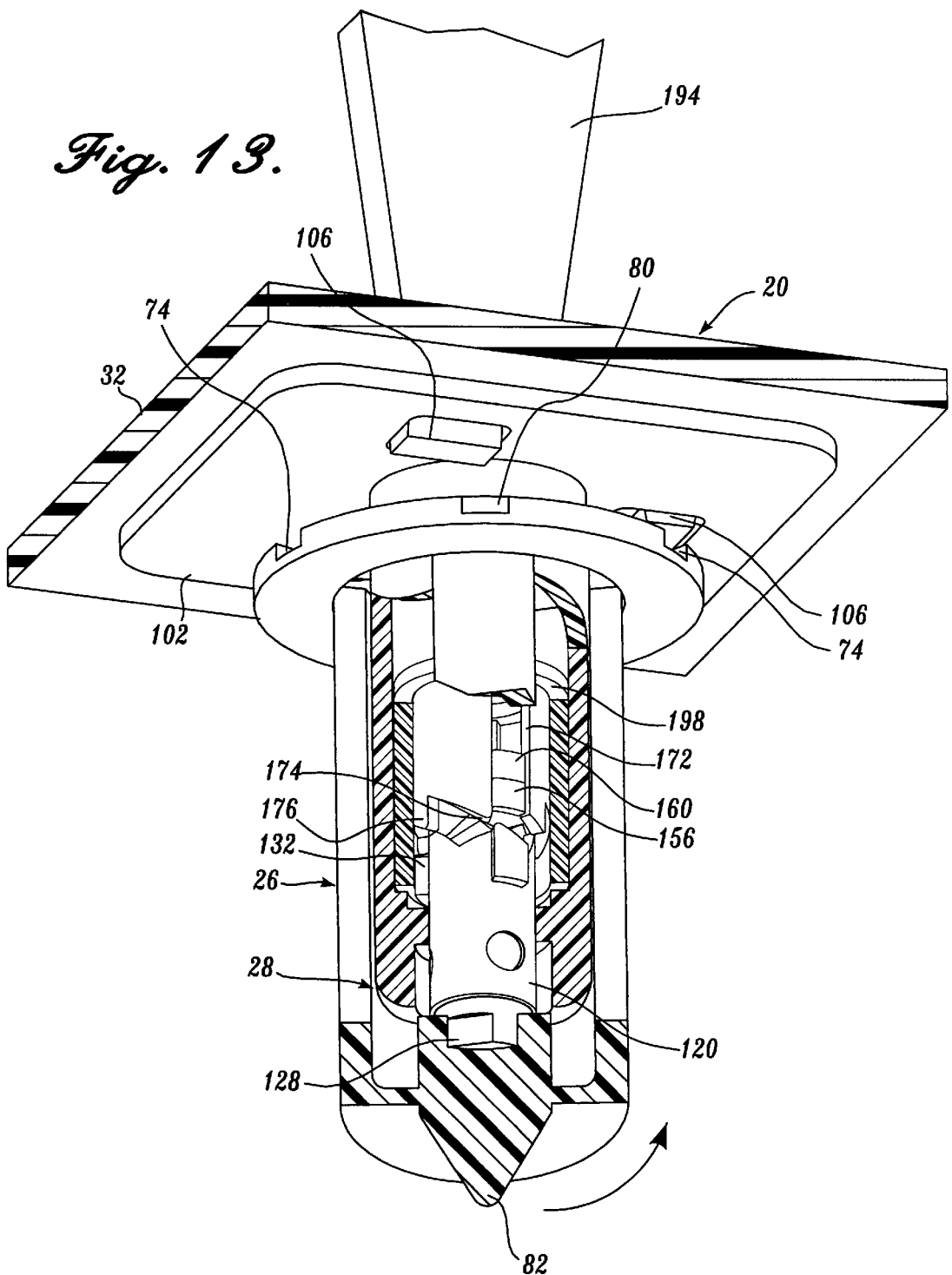

CONTACTLESS SWITCH

FIELD OF THE INVENTION

The present invention relates generally to electrical switches and, more particularly, to contactless push button switches.

BACKGROUND OF THE INVENTION

The operator's compartment of most commercial vehicles, such as the cockpit of an airplane, generally includes at least one control panel. The control panel includes a plurality of switches that are in communication with a variety of electrical or hydraulic systems. In a typical system, actuation of the switch produces a relatively low current output to activate the switching action of a larger driver circuit. Such driver circuits are used to actuate a variety of systems, such as the landing gear or running lights of the vehicle.

Switches currently available for such systems include both contact and contactless switches. Contact switches include gold-plated leaf springs that may be actuated into and out of physical contact with the driver circuit. Typically, these switches include a tactile response to indicate when the switch changes state.

Contactless switches generally include a magnet and a sensor that is sensitive to magnetic forces to produce electronic control pulses. In a typical contactless switch, the magnets are permanently mounted to a device that is either rotated or linearly translated into close proximity with the sensors to change the state of the switch. In contactless switches having linear translation of magnets, the switch may also include a separate tactile mechanism. The tactile mechanism is coupled to the translation of the magnets to produce a tactile response while changing the state of the switch. A tactile response is desirable because it allows the operator to confirm actuation of the particular system without requiring visual confirmation. Although both contact and contactless switches are effective at changing the state of a switch, they are not without problems.

Relative to contact switches, because physical contact between the switch leaf springs and circuit is required to close the circuit, such switches often suffer high rates of failure. Additionally, debris or corrosion may build up between the switch leaf springs and circuit, thereby causing an unintended and undesirable increase in the impedance of the switch. Contactless switches tend to be expensive because they require a separate tactile mechanism coupled to the switch actuation to produce the anticipated tactile response. Further, due to the tactile mechanism, such contactless switches have additional parts and, therefore, they are not only difficult to manufacture, but also have a greater chance of failure.

Thus, there exists a need for a contactless switch that not only produces an anticipated tactile response, but is also economical to manufacture, has a high degree of reliability and meets the performance expectations of the end user.

SUMMARY OF THE INVENTION

In accordance with the present invention, a contactless switch is provided.

The contactless switch is actuatable between a closed circuit position and an open circuit position. The contactless switch includes a housing and a linear actuator disposed within the housing. The contactless switch also includes a linear-to-rotary motion assembly disposed within the housing. The linear-to-rotary motion assembly is coupled to the linear actuator for producing rotary motion of the linear-to-rotary motion assembly in response to a linear displacement of the linear-to-rotary motion assembly by the linear actuator. The contactless switch further includes a plurality of Hall effect sensors and magnets. The sensors are disposed within the housing, while the magnets are disposed on the linear-to-rotary motion assembly. The magnets are rotated into and out of close proximity with the sensors by the linear-to-rotary motion assembly when the switch is actuated by applying a force to the linear actuator.

In accordance with further aspects of this invention, the contactless switch further includes a first biasing member disposed within a housing and coupled to the linear-to-rotary motion assembly to rotate the assembly and bias the switch into the closed circuit position.

In accordance with other aspects of this invention, the contactless switch also includes a tactile response mechanism formed with the linear-to-rotary motion assembly to produce a tactile response when the contactless switch is actuated between the open and closed circuit positions.

In accordance with still other aspects of this invention, the contactless switch further includes a hold down mechanism disposed within the housing to selectively lock the switch into the open circuit position.

A contactless switch formed in accordance with the present invention has several advantages over currently available contact and contactless switches. The linear-to-rotary motion assembly integrates the tactile response mechanism with the mechanism that actuates the magnets into and out of close proximity with the sensors. This results in a switch having fewer parts and, therefore, greater reliability. Such a switch has a longer useful life than contact switches currently available because there is no physical contact between switch components. Furthermore, a contactless switch formed in accordance with the present invention is also cheaper to manufacture because of the lower part count. Thus, a contactless switch formed in accordance with the present invention is economical to produce, has a high switching action reliability and produces the customary and anticipated tactile response while changing state of the switch.

BRIEF DESCRIPTION OF THE DRAWINGS

The foregoing aspects and many of the attendant advantages of this invention will become better understood by reference to the following detailed description, when taken in conjunction with the accompanying drawings, wherein:

FIG. 13 is a perspective view of a contactless switch formed in accordance with the present invention with the switch housing partially cut away to show the alignment of the major elements of the cam assembly as it is being actuated into the closed circuit position.

DETAILED DESCRIPTION OF THE PREFERRED EMBODIMENT

Figure 1:
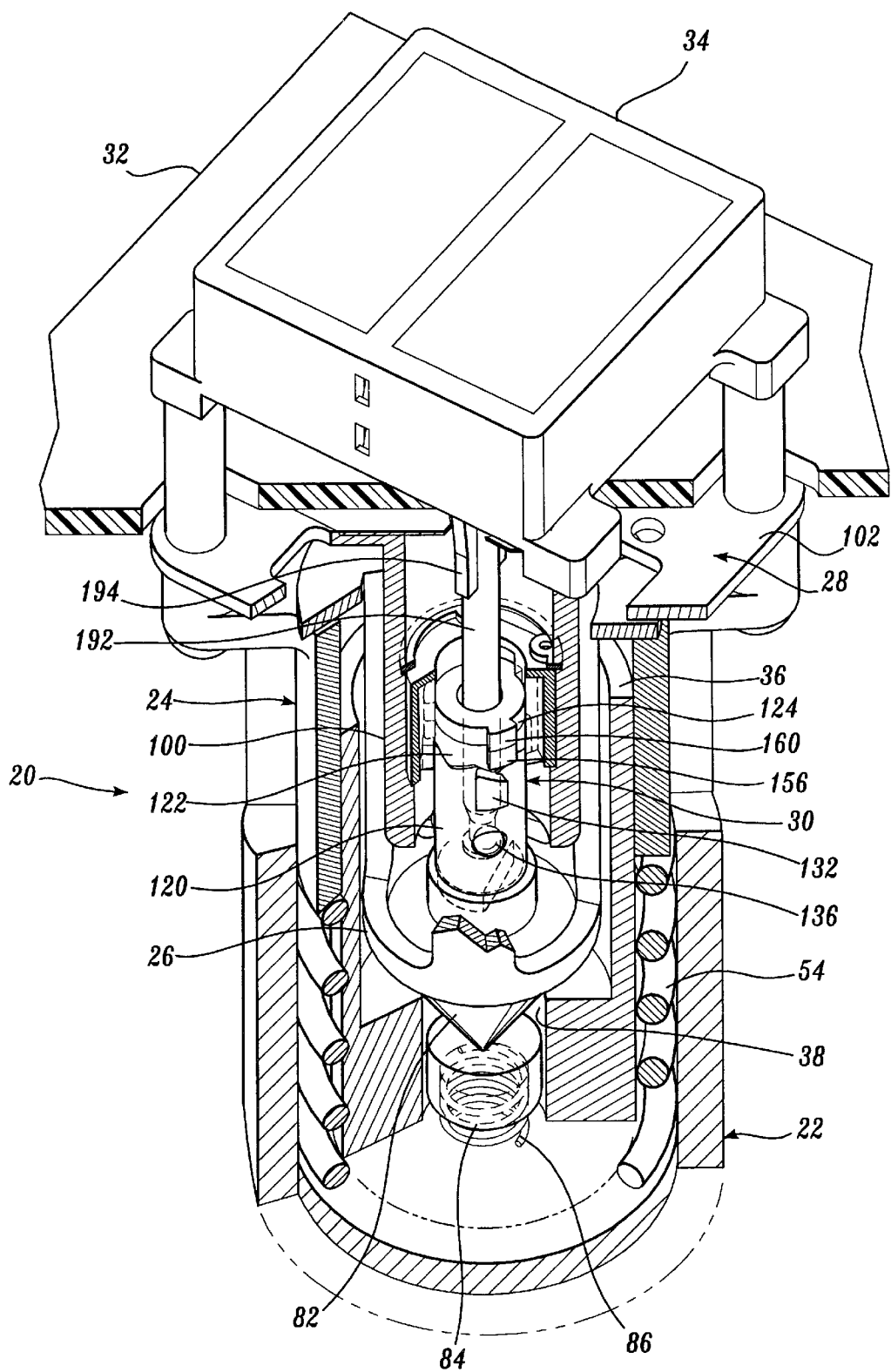
FIG. 1 is a perspective view of a contactless switch formed in accordance with the present invention with portions thereof cut away for clarity.
Figure 2:
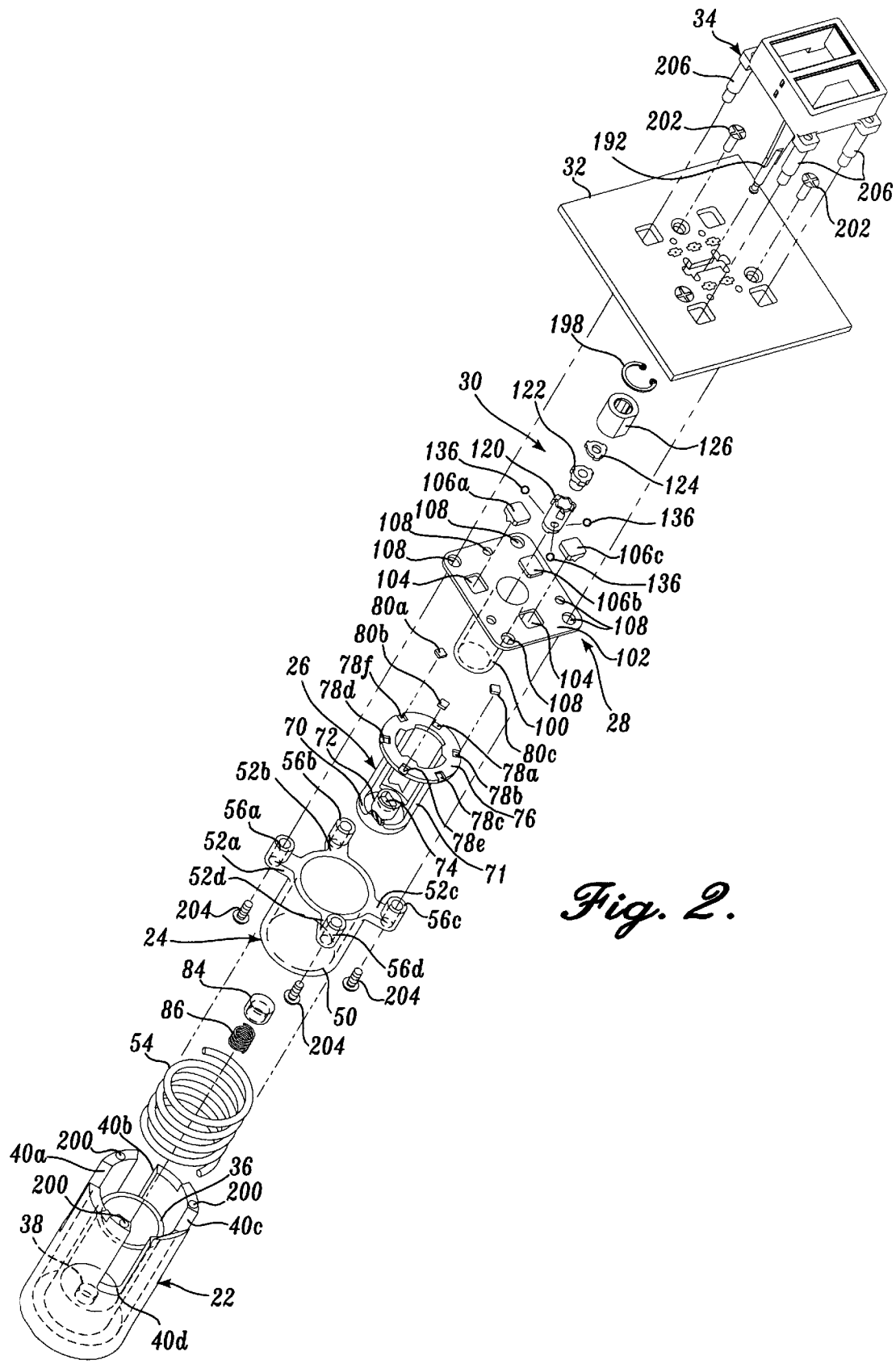
FIG. 2 is an exploded perspective view of a contactless switch formed in accordance with the present invention showing the major elements of the switch.

FIGS. 1 and 2 illustrate a preferred embodiment of a contactless switch 20 constructed in accordance with the present invention. The switch 20 is sized and adapted to be received within a control panel (not shown) of a commercial vehicle, such as an airplane. Preferably, such switches 20 are used within the vehicle to actuate a variety of systems. As a non-limiting example, a switch 20 constructed in accordance with the present invention may be used to actuate a driver circuit adapted to reciprocate landing gear of an airplane between its retracted and extended positions. In this regard, the switch 20 produces a relatively low current output signal to the driver circuit to actuate the landing gear. While normally used in a substantially horizontal orientation, for ease of illustration, the switch 20 is shown in a vertical orientation as seen in FIGS. 1–13. Therefore, the terminology vertical, upper, lower, etc., should be construed as descriptive, not limiting.

The contactless switch 20 includes a switch housing 22, a cap guide 24, a carousel 26, an inner housing 28, a cam assembly 30, a printed circuit board 32 and a switch cap 34. The switch housing 22 is suitably injection molded from a thermoplastic and is cylindrical in shape. The switch housing 22 has a bottom surface and an open upper end. The switch housing 22 includes a cylindrically shaped guide 36 centrally located within the switch housing 22. The guide 36 is coaxial with the length of the switch housing 22 and extends from the bottom of the switch housing 22 towards the open upper end. Preferably, the guide 36 is integrally formed with the interior of the switch housing 22 and has a diameter that is less than the diameter of the switch housing 22, such that the cap guide 24 is slidably and coaxially received therebetween, as is described in greater detail below. The guide 36 also includes a centrally located cavity 38 formed in the bottom of the guide 36. The cavity 38 is sized to receive a spring, as is also described in greater detail below.

The switch housing 22 also includes a plurality of vertical slots 40a–40d (FIG. 2) extending through the thickness of the wall of the switch housing 22. Preferably, the slots 40a–40d extend from the top of the switch housing 22 to a point substantially midway between the top and bottom of the switch housing 22. The slots 40a–40d are located along the perimeter of the housing 22 to permit linear translation of the cap guide 24 therein, as is described in greater detail below.

The cap guide 24 includes a tubular body 50 and radially projecting L-shaped attachment members 52a–52d. The body 50 is sized to be slidably received between the inside surface of the switch housing 22 and the outside surface of the guide 36 on a first helical spring 54, such that the guide 36 is coaxially received within the cap guide 24. The first spring 54 biases cap guide 24 upwardly within the switch housing 22.

When mounted within the switch housing 22, the attachment members 52a–52d are slideably received within and project out from the slots 40a–40d of the switch housing 22. Each attachment member 52a–52d extends radially outward from the upper end of the cap guide 24 and includes fastener stems 56a–56d extending upwardly from the free end of each attachment member 52a–52d.

Still referring to FIGS. 1 and 2, the carousel 26 will now be described in greater detail. The carousel 26 includes a tubular carousel body 70. The carousel body 70 has a closed bottom surface and an open upper end longitudinally spaced from the bottom by a plurality of longitudinal ribs 71. For clarity and ease of illustration, a portion of the ribs 71 has been removed in FIGS. 1 and 2. Integrally formed within the carousel body 70 is a collar 72 extending up a predetermined distance from the bottom of the carousel body 70. The collar 72 includes a keying notch 74. The keying notch 74 is sized to receive a portion of the cam assembly 30 to both rotate and linearly translate the carousel 26 within the switch housing 22 in response to a linear input from the cam assembly 30, as is described in greater detail below.

The carousel 26 also includes a flange 76 extending normally and radially outward from the open upper end of the carousel body 70. The flange 76 has an outside diameter sized to be received within the inside diameter of the switch housing 22. The upper surface of the flange 76 includes a plurality of recessses 78a–78f. Preferably, the recesses 78a–78f are formed at equally spaced intervals around the perimeter of the flange 76. In a preferred embodiment, the notches 78a–78f are formed at 60 degree intervals. Each notch 78a–78f is sized to receive a magnet 80, such as a rare earth magnet. In the first preferred embodiment of FIG. 2, there are three magnets 80 spaced at 120 degree intervals. Although a total of three magnets 80 are illustrated, it is to be noted that the invention is not intended to be so limited. As described in greater detail below, alternate embodiments of a switch formed in accordance with the present invention may include greater or fewer magnets at equal intervals.

As may be seen best by referring back to FIG. 1, the carousel 26 includes a conically shaped and centrally disposed tip 82 extending downwardly from the outside surface of the bottom of the carousel 26. The tip 82 is integrally formed with the carousel 26, and tapers such that the diameter of the tip 82 decreases at a predetermined rate from the bottom of the carousel 26 to the end of the tip 82. The carousel 26 is slidably and rotatably received within the cap guide 24, such that the tip 82 extends through the bottom of the cap guide 24 and is seated within the cavity 38 on a carousel spring cap 84. Disposed within the cavity 38 and extending between the spring cap 84 and the bottom of the switch housing 22 is a carousel spring 86. The carousel spring 86 biases the carousel 26 upwardly within the switch housing 22 to urge the switch 20 into a closed circuit position, as is described in greater detail below.

Referring to FIG. 2, the inner housing 28 will now be described in greater detail. Preferably, the inner housing 28 is injection molded from a thermoplastic and includes a tubular stem 100 and a rectangularly shaped attachment plate 102. The stem 100 is integrally formed with the attachment plate 102, such that it extends normal to the plate 102. The attachment plate 102 includes a centrally located bore extending through its thickness and longitudinally through the stem 100, such that a portion of the cap assembly 34 extends therethrough.

The attachment plate 102 further includes a plurality of vertically extending openings 104a–104c. The openings 104a–104c are sized to receive well known galvanomagnetic effect sensors 106a–106c, such as Hall effect sensors. Preferably, the openings 104a–104c are formed at equally spaced intervals on the attachment plate 102. In the first preferred embodiment of FIG. 2, the openings 104a–104c are spaced at 120 degree intervals around the perimeter, as measured from the center of the bore extending through the attachment plate 102. The attachment plate 102 also includes a plurality of vertically extending fastener bores 108. The bores 108a–108d are adapted to fasten the inner housing 28 to both the switch housing 22 and the switch cap 34, as is described in greater detail below.

Figure 3:
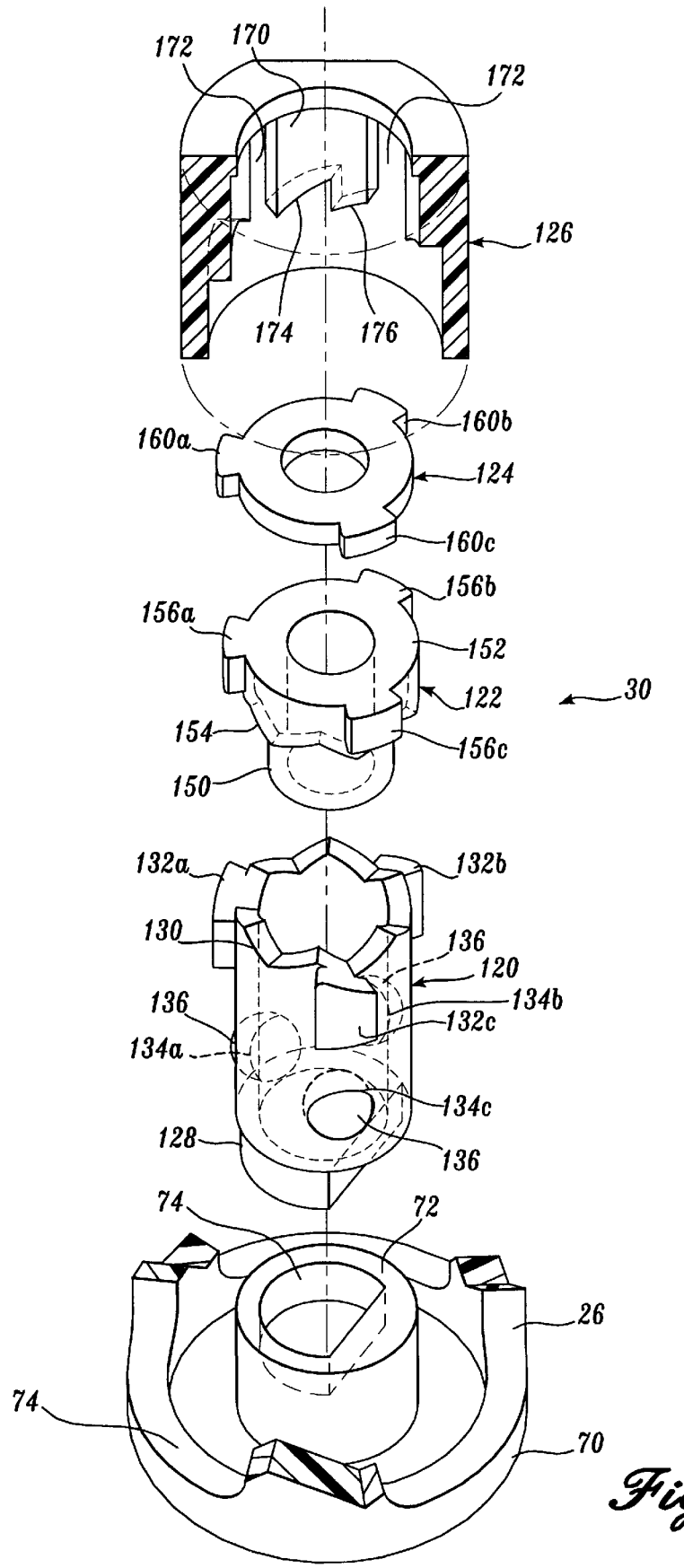
FIG. 3 is an exploded perspective view of a cam assembly for a contactless switch formed in accordance with the present invention with portions thereof cut away for clarity.

Referring now to FIGS. 2 and 3, the cam assembly 30 will be described in greater detail. The cam assembly 30 includes a cylindrical actuator 120, a cylindrical cam 122, a cam spacer 124 and a cam guide 126. The actuator 120 includes a bottom surface and an open upper end. Integrally formed with the outside of the bottom of the actuator 120 is a tab 128. The tab 128 is sized to be received within the keying notch 74 located in the bottom of the carousel 26. The keying notch 74 and the tab 128 are complimentary, such that when the switch 20 is assembled, rotation of the actuator 120 results in rotation of the carousel 26, as is described in greater detail below.

The open end of the actuator 120 is contoured to define a crown cam 130. The crown cam 130 is substantially saw-toothed in configuration, such that a plurality of alternating positively and negatively sloped surfaces are located along the perimeter of the upper end of the actuator 120. The crown cam 130 is sized to cooperate with a cammed surface located on the cam 122 to rotate the actuator 120 and carousel in response to a linear displacement of the cam 122, as is described in greater detail below.

The actuator 120 also includes actuator ribs 132a–132c integrally formed with the exterior of the actuator 120. The actuator ribs 132a–132c extend radially from the side of the actuator 120 and downwardly from the crown cam 130. The actuator ribs 132a–132c are located adjacent the crown cam 130, such that the upper surface of each rib 132a–132c is sloped to correspond with the adjacent sloping surface of the crown cam 130. Preferably, the actuator ribs 132a–132c are located at equally spaced intervals around the perimeter of the actuator 120. In the first preferred embodiment of FIG. 3, the actuator ribs 132a–132c are spaced at 120 degree intervals. The actuator ribs 132a–132c are rectangular in shape and are adapted to limit rotational movement of the actuator 120, as is described in greater detail below.

Preferably, the actuator 120 includes a plurality of ball retention cavities 134a–134c. Each cavity 134a–134c extends laterally through the wall of the actuator 120. Preferably, one cavity 134a–134b is located below each actuator rib 132a–132c. Each cavity 134a–134c has a diameter that decreases from the inner wall of the actuator 120 to the outer wall, such that the cavity is frustoconical in shape. Each cavity 134a–134c is sized to receive a ball 136 therein to selectively lock the switch 20 into an open circuit position, as is described in greater detail below.

The cam 122 is suitably injection molded from a thermoplastic and includes a tubular stem 150 and an annular cap 152. The diameter of the stem 150 is sized to be telescopically received within the central bore of the actuator 120. The cap 152 extends radially outward from the upper end of the stem 150, such that the cam 122 is T-shaped when viewed in profile. The outside diameter of the cap 152 is equal to the outside diameter of the actuator 120. The lower surface of the cap 152 includes a cam portion 154. The cam portion 154 is substantially saw-toothed in configuration and is sized to fit complimentarily with the crown cam 130 of the actuator 120 when the cam 122 is slidably received within the actuator 120. Integrally formed and radially projecting outward from the cap 152 are cam ribs 156a–156c. The cam ribs 156a–156c extend downwardly from the upper surface of the cap 152. Preferably, the cam ribs 156a–156c are equally spaced around the perimeter of the cap 152. In the first preferred embodiment, the cam ribs 156a–156c are spaced at 120 degree intervals. Although the cam portion 154 and the crown cam 130 are complimentarily shaped, the cam ribs 156a–156c and the actuator ribs 132a–132c are not coaxially aligned when the respective cammed portions are aligned, as is described in greater detail below.

The disk shaped cam spacer 124 includes a plurality of cam spacer ribs 160a–160c extending radially outward from the outside surface of the cam spacer 124, corresponding to the perimeter of the cam ribs 156a–c. The cam spacer 124 thus includes a centrally located bore extending through the vertical direction of the spacer. The thickness of the cam spacer 124 in the vertical direction determines the stroke length of the cap assembly 34 to actuate the switch between the open and closed circuit positions, as is described in greater detail below.

The tubular cam guide 126 is suitably injection molded from a thermoplastic. The cam guide 126 is sized to slidably receive the actuator 120, cam 122 and cam spacer 124 therein. Integrally formed with the upper end of the cam guide 126 is an annular shoulder 178. The shoulder 178 projects radially inward from the inside surface of the cam guide 126. The shoulder 178 limits linear translation of the actuator 120, cam 122 and cam spacer 124 therein, as is described in greater detail below.

As may be best seen by referring to FIG. 3, the inside surface of the cam guide 126 includes a plurality of substantially rectangular projections 170a–170c. The projections 170a–170c project radially inward from the inside surface of the cam guide 126 and they extend down from the lower surface of the shoulder 178 for a predetermined distance. Preferably, the projections 170a–170c are spaced by vertically extending channels 172. The channels 172 are sized to receive the actuator ribs 132, cam ribs 156 and the cam spacer ribs 160 therein to limit rotation of the cam 122 and cam spacer 124 during actuation of the switch 20, as is described in greater detail below.

The lower surface of each projection 170a–170c is contoured to define a sloped surface 174 and an abutment surface 176. The sloped surface 174 angles diagonally towards the shoulder 178, from the lower end of the projection 170a–170c, towards the other end thereof for a predetermined distance where it terminates adjacent the abutment surface 176. The abutment surface 176 extends vertically downward from the sloped surface 174, such that the abutment surface 176 forms an abrupt edge adjacent the sloped surface 174 to limit rotation of the actuator 120 and carousel 26 to a predetermined degree of rotation per button stroke. The slope of the cammed surfaces of the crown cam 130 and cam portion 154 and the angle of the sloped surface 174 may be sized as desired to rotate the actuator 120 a predetermined amount. In the first preferred embodiment of the present invention, the crown cam 130, cam portion 154, the angle of the sloped surface 174 and the location of the abutment surface 176 are coordinated to rotate the actuator 120 in 60 degree intervals, as is described in greater detail below.

Although it is preferred that the projections 170a–170c include an abutment surface 176, an abutment surface 176 is not required for operation of the invention. As a non-limiting example, the sloped surface 174 may extend from the lower end of the projection 170 across to the opposite corner of the projection, such that the sloped surface extends diagonally from the top of the projections 170a–170c to the base of the projections 170a–170c. In this alternate embodiment, (not shown) switch actuation between the open and closed circuits occurs only for the duration that the switch cap 34 is manually held in a down position. As a result, the actuator 120 rotates in 60 degree increments for the duration the cap assembly 34 is held in the down position. The actuator utilized in this alternate embodiment of the invention is commonly known as a momentary action device.

For clarity and ease of illustration, a portion of the cam guide 126 has been partially cut away in FIG. 3 to show the interior surface of the cam guide 126. As a result, portions of the second and third projections 170b and 170c have been cut away. However, it should be noted that the second and third projections 170b and 170c are configured identically as described above for the first projection 170a. Although a total of three projections 170a–170c is preferred, more or fewer projections may be formed within the cam guide 126.

Figure 4:
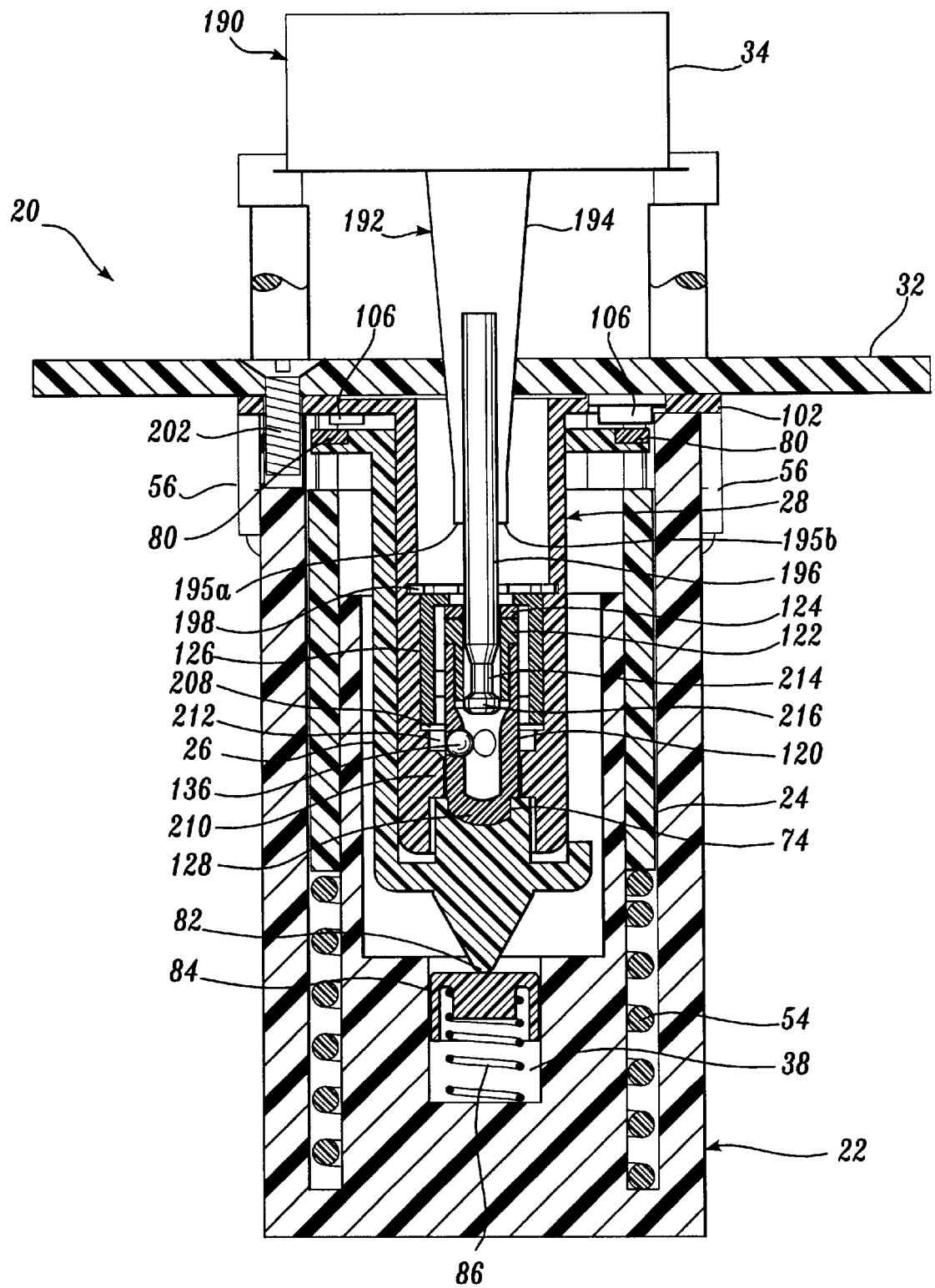
FIG. 4 is a longitudinal cross-sectional view of a contactless switch formed in accordance with the present invention shown in a closed circuit position.

Referring to FIGS. 2 and 4, the switch cap 34 will now be described in greater detail. The cap assembly 34 is suitably injection molded from a thermoplastic and includes a rectangularly shaped switch button 190 and an integrally formed stem portion 192. The stem portion 192 includes a wedge-shaped upper stem 194 and a cylindrically-shaped lower stem 196. The upper stem 194 depends downwardly from the bottom surface of the switch button 190 and is centrally located with the switch button 190. The lower stem 196 depends downwardly from the lower edge of the upper stem 194. The lower edge of the upper stem 194 is truncated, such that a pair of ribs 195a and 195b are formed on opposite sides of the lower stem 196. The lower portion of the lower stem 196 has a band with a diameter that is less than the upper portion of the lower stem 196 to define a ball retention groove 214. The retention groove 214 is sized to receive the balls 136a–136c of the actuator 120 therein to selectively lock the switch 20 into the open circuit position, as is described in greater detail below.

The lower tip of the stem 196 just below the retention groove 214 defines a disk-like pusher 216. The pusher 216 has a diameter substantially equal to that of the upper portion of the lower stem 196 and is sized to be slidably received within the actuator 120. The pusher 216 is adapted to cooperate with the balls 136a–136c to selectively lock the switch 20 into the open circuit position, as is also described in greater detail below.

For ease of illustration and clarity, many well known components of the switch cap 34, such as reflector assemblies secured to the printed circuit board 32 and illumination assemblies, have not been illustrated or described. However, it is noted that a switch formed in accordance with the present invention suitably includes such well known elements.

Assembly of the switch 20 may be best understood by referring to FIGS. 2 and 4. As noted above, the cap guide 24 is received within the switch housing 22 on the first spring 54. The stem 100 of the inner housing 28 is slidably received within the carousel 26. The cam spacer 124, cam 122 and actuator 120 are received within the cam guide 126 such that the cam spacer 124 is seated against the inside of the upper surface of the cam guide 126 and the cam 122 is seated against the lower surface of the cam spacer 124. Further, the actuator 120 is seated against the cam 122, such that the crown cam 130 and cam portion 154 oppose each other.

As assembled, the cam guide 126 is received within the inner housing 28 on an annular rim 208 extending radially inward from the inside surface of the inner housing 28. As received, the tab 128 located on the bottom outside surface of the actuator 120 is keyed to the keying notch 74 located in the bottom of the carousel 26. The cam guide 126 is removably fastened within the inner housing 28 by a well known fastener, such as a retainer ring 198. As may be best seen by referring to FIG. 4, the retainer ring 198 fits within an annular groove located within the inside surface of the inner housing 28. The retainer ring 198 is retained within the groove, such that it is flush against the upper surface of the cam guide 126. The cam guide 126 is thus secured between the annular rim 208 and the retainer ring 198. The cam guide 126 has a flat section or similar detail that prevents it from rotating inside the inner housing 28.

The inner housing 28 defines an annular shoulder 210 located a predetermined distance below the rim 208. The shoulder 210 projects radially inward from the inside surface of the inner housing 28 to form a socket 212 when the cam guide 126 is received within the inner housing 28. The socket 212 is located between the lower surface of the cam guide 126 and the upper surface of the shoulder 210 and extends between the inside surface of the inner housing 28 and the actuator 120. The edge of the shoulder 210, adjacent the actuator 120, is chamfered to facilitate movement of the balls 136 into and out of the socket 212, as is described in greater detail below.

The inner housing 28 is sandwiched between the PCB 32 and is fastened to the switch housing 22 by well known fasteners 202, such as screws, extending through one of the fastener bores 108 and into corresponding internally threaded bores 200 located in the upper surface of the switch housing 22.

A well known printed circuit board 32 may be fastened to the upper side of the attachment plate 102 of the inner housing 28 by well known fasteners 202, such as screws, extending through attachment bores 222 located in the printed circuit board 32. The Hall effect sensors 106 are operatively connected to the printed circuit board 32 in a manner well known in the art. As is also well known in the art, the printed circuit board 32 includes a plurality of traces (not shown) adapted to communicate with a driver circuit (not shown). As previously discussed, the driver circuit is in communication with a system of the vehicle in a manner well known in the art. The switch cap 34 is fastened to the cap guide 24 by a plurality of fasteners 204, such as screws, extending vertically through the fastener stems 56a–56d of the cap guide 24.

Operation of the switch 20 of the present invention may be best understood by referring to FIGS. 4–13. The switch 20 has at least two distinct positions; a closed circuit position and an open circuit position.

Figure 5:
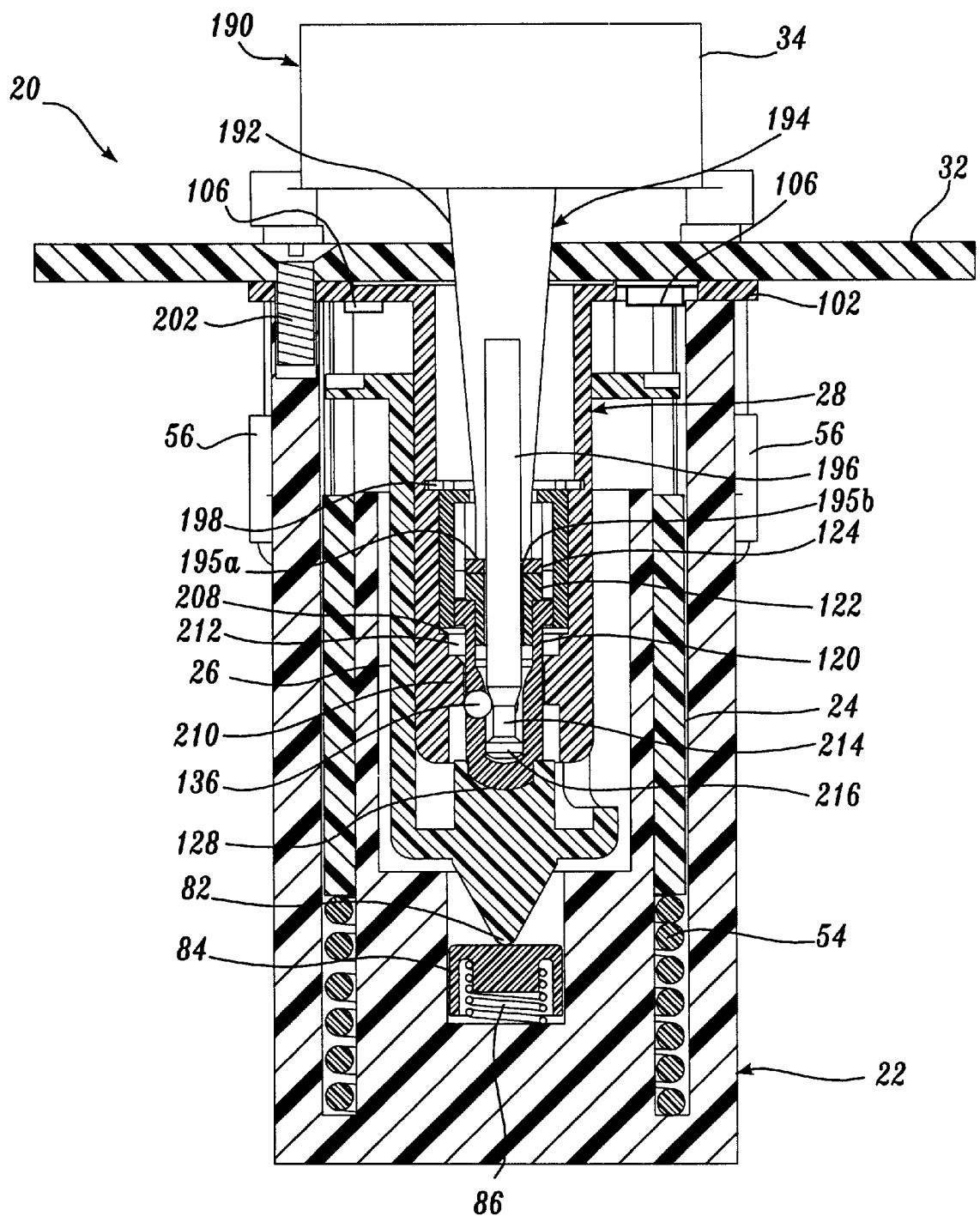
FIG. 5 is a perspective view of a contactless switch formed in accordance with the present invention with a portion of the switch housing cut away to show the interaction of the cam assembly when the switch is in the closed circuit position.

The closed circuit position may be best understood by referring to FIGS. 4 and 5. In FIG. 4, the switch cap 34 is longitudinally displaced upward within the switch housing 22 by the first spring 54. The first spring 54 biases the cap guide 24 upwardly within the switch housing 22, such that the fastener stems 56a–56d are seated against the lower surface of the attachment plate 102 of the inner housing 28. Because the switch cap 34 is fastened to the cap guide 24, further upward movement of the switch cap 34 is prevented by the cap guide 24 stopping on the lower surface of the attachment plate 102. In this closed circuit position, the carousel 26 is biased upwardly within the switch housing 22 by the carousel spring 86. In this position, and as described above, because the upper surface of the cam spacer 124 is seated against the upper surface of the cam guide 126 and because the actuator 120 and carousel 126 are cooperatively engaged, further upward movement as the carousel 126 is prevented. Additionally, the magnets 80 are oriented in close proximity to the Hall effect sensors 106. As a result, and as is well known in the art, current flows through the Hall effect sensors 106 in response to the magnetic field, thereby closing the circuit and actuating the driver circuit.

As may be best seen by referring to FIG. 5, in the closed circuit position, the actuator ribs 132, the cam ribs 156 and the cam spacer ribs 160 are vertically aligned within the vertical channels 172 of the cam guide 126. As positioned, rotation of the actuator and carousel 26 is prevented by the interference fitting of the ribs within the vertical channels 172. Thus, the risk of inadvertent rotation of the magnets 80 out of communication with the Hall effect sensors 106 is reduced.

Figure 6:
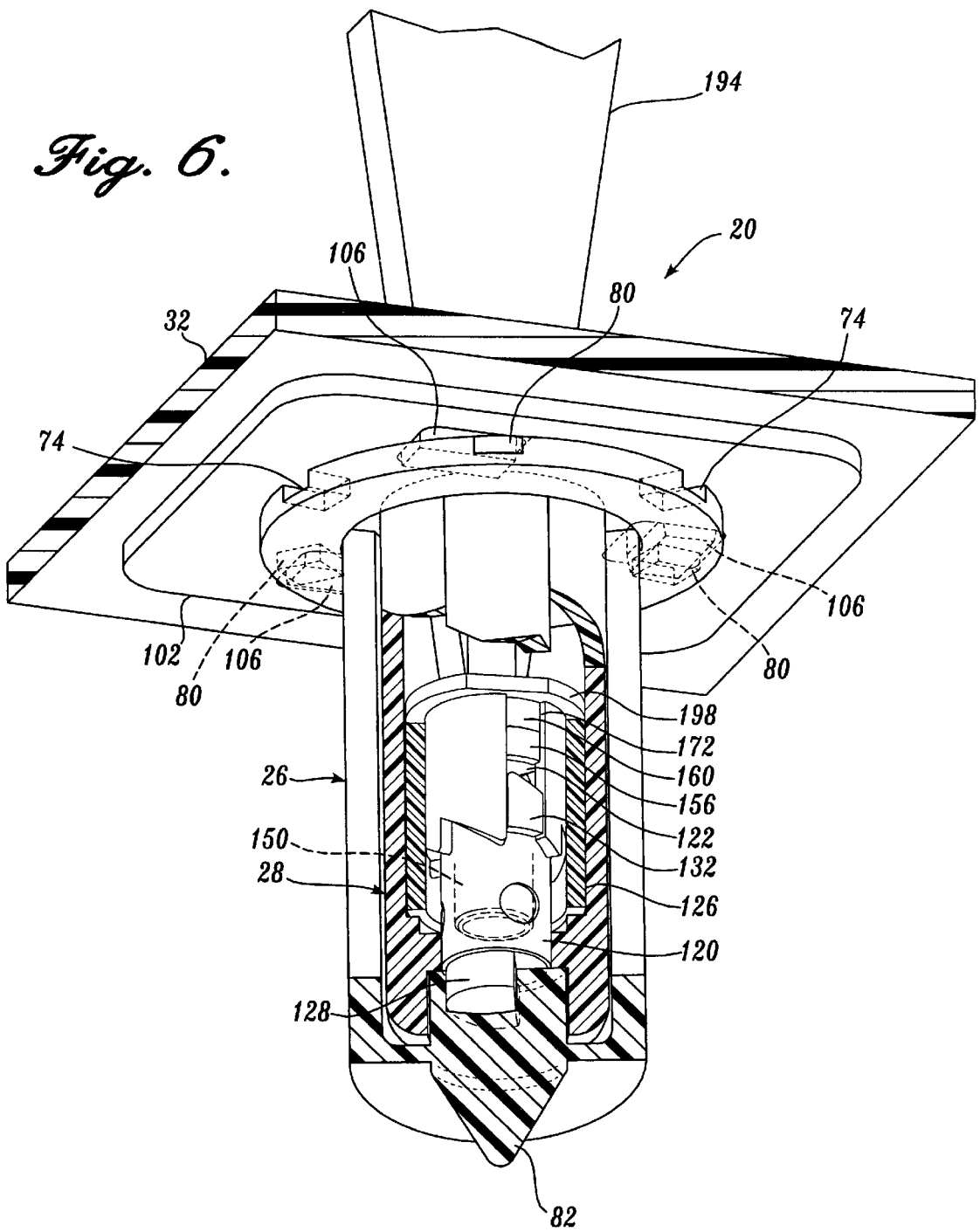
FIG. 6 is a longitudinal cross-sectional view of a contactless switch formed in accordance with the present invention showing the interaction of the major elements of the switch as the switch is being actuated from the closed circuit position of FIG. 4 to an open circuit position.

Actuation of the switch 20 from the closed circuit position to the open circuit position may be best understood by referring to FIGS. 6–9. In FIG. 6, changing the switch state begins by depressing downwardly on the switch cap 34, thereby causing the stem portion 192 to slide downwardly within the cam assembly 30. As a downward pressure is continually applied to the switch cap 34, the lower edges of the ribs 195a and 195b pass through the retainer ring 198 and the centrally located bore of the cam guide 126 until the ribs 195a and 195b engage the upper surface of the cam spacer 124. As the switch cap 34 translates within the switch housing 22, the ribs 195a and 195b push downwardly on the cam assembly 30 by engaging the cam spacer 124 upper surface. Simultaneously, with the downward motion of the cam assembly 30, the pusher 216 engages the balls 136a–136c, thereby pushing the balls 136a–136c partially within the socket 212. As the cap assembly 34 is depressed toward the cam assembly 30 and the pusher 216 passes by the balls, the balls roll from the socket 212 and partially into the retention groove 214, as seen in FIG. 6.

Figure 7:
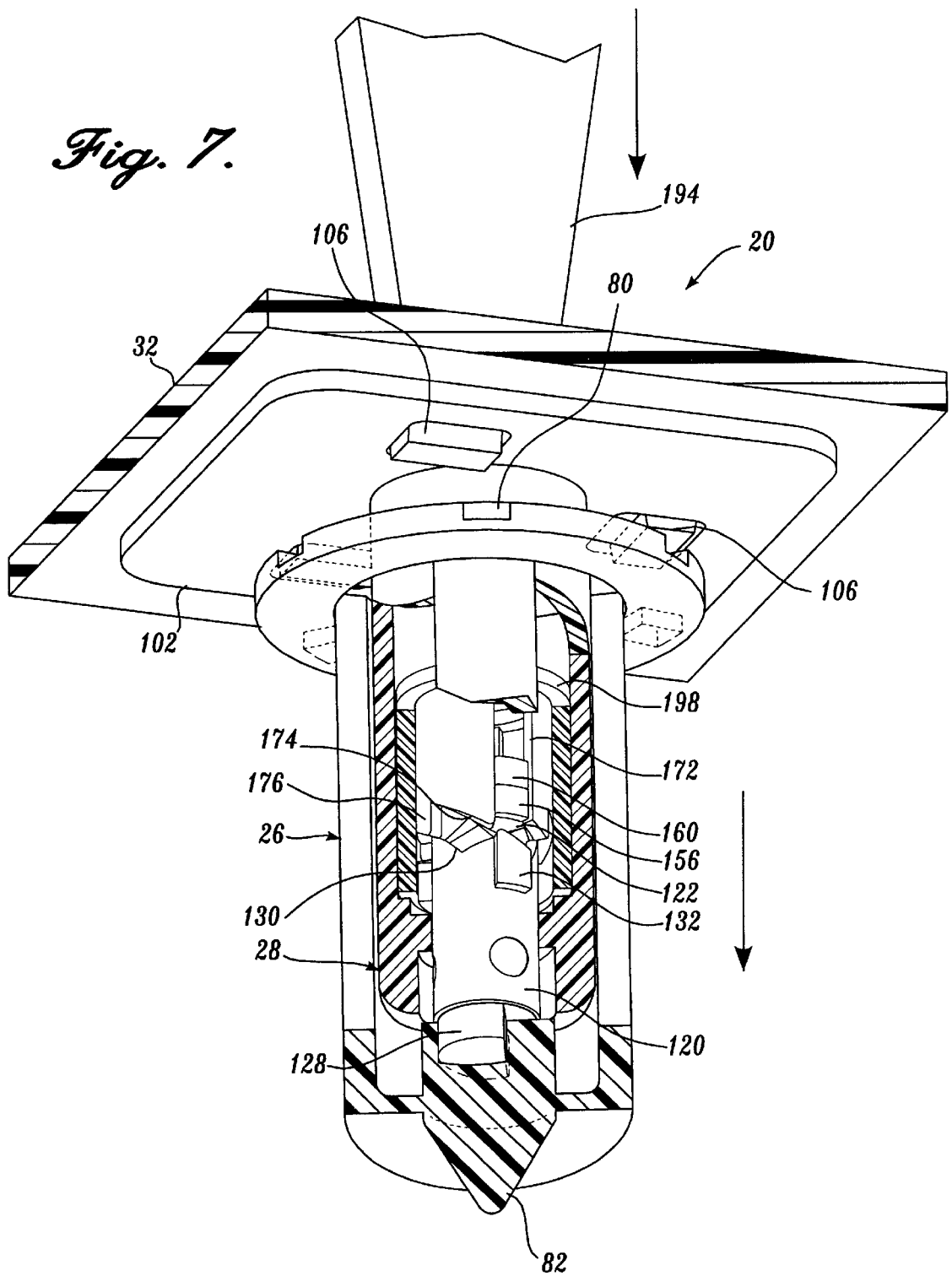
FIG. 7 is a perspective view of a contactless switch formed in accordance with the present invention with the switch housing partially cut away to show linear displacement of the cam assembly as the switch is being actuated between the closed and open circuit positions.

As the ribs 195a and 195b push downwardly against the cam assembly 30, the lower end of the actuator 120 drives the carousel 26 downwardly within the switch housing 22 against the spring cap 84. Translation of the switch cap 34 continues downwardly until the carousel spring 86 is nearly fully compressed. As may be best seen by referring to FIG. 7, the cam spacer ribs 160, cam ribs 156 and actuator ribs 132 translate linearly within the channel 172 of the cam guide 126 as the carousel spring 86 is nearly fully compressed. As seen in FIG. 7, the teeth of the cammed portion 154 and crown cam 130 of the cam 122 and actuator 120, respectively, are misaligned by a predetermined amount when the ribs 156 and 132 are aligned in a vertical direction within the channel 172. In particular, the apex of the crown cam 130 is positioned off center from the apex of the cam portion 154 of the cam 122. As a result, the actuator 120 is biased to slide along the sloped portion 174 of the cam guide 126, towards the abutment surface 176, as is described in greater detail below.

Figure 8:
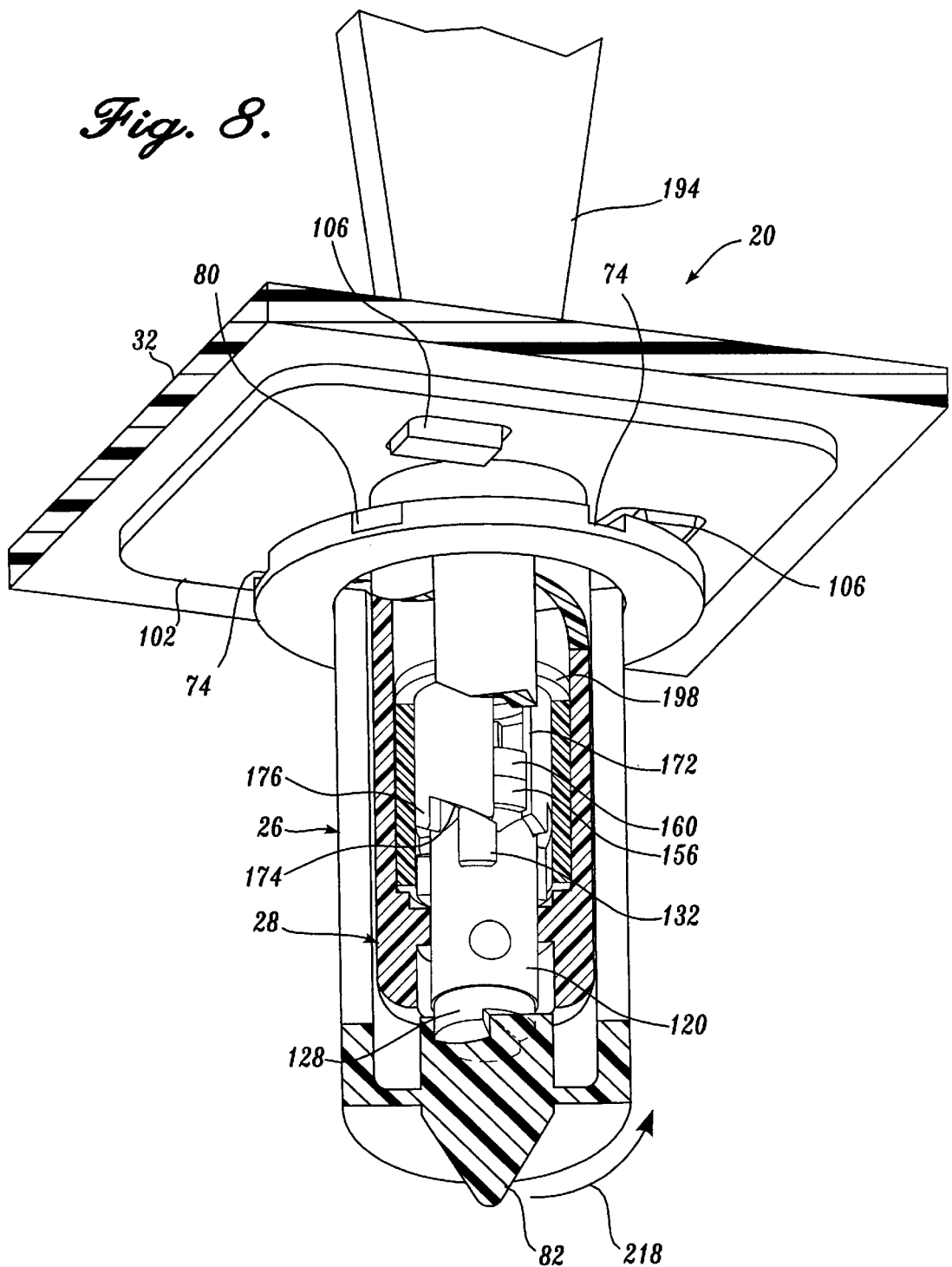
FIG. 8 is a perspective view of a contactless switch formed in accordance with the present invention with the switch housing partially cut away to show the initial rotation of the cam assembly.

Referring to FIG. 8, as the switch cap 34 is depressed further against the carousel spring 86, the spring force pushes upwardly against the tip 82 of the carousel 26, such that when the actuator rib 132 reaches the free end of the channel 172, the upward biasing force of the carousel spring 86 causes the teeth of the crown cam 130 to slide into complementary alignment with the cam portion 154 of the cam 122. As a result, because the carousel 26 is keyed to the rotation of the actuator 120 by the keying feature of the tab 128, the carousel 26 rotates in a counterclockwise direction around the longitudinal direction of the stem portion 192, as indicated by the arrow 218. Rotational movement of the cam 122 and cam spacer 124 is prevented by the interlocking fit of the cam ribs 156 and cam spacer ribs 160 within the channel 172. Thus, the cam 122 and cam spacer 124 have only translational movement within the switch housing 22, while the actuator 120 and carousel 26 have both translational and rotational movement within the switch housing 22. The cam guide 126 is prevented from rotating within the inner housing 28 by the flat surface on both parts.

Figure 9:
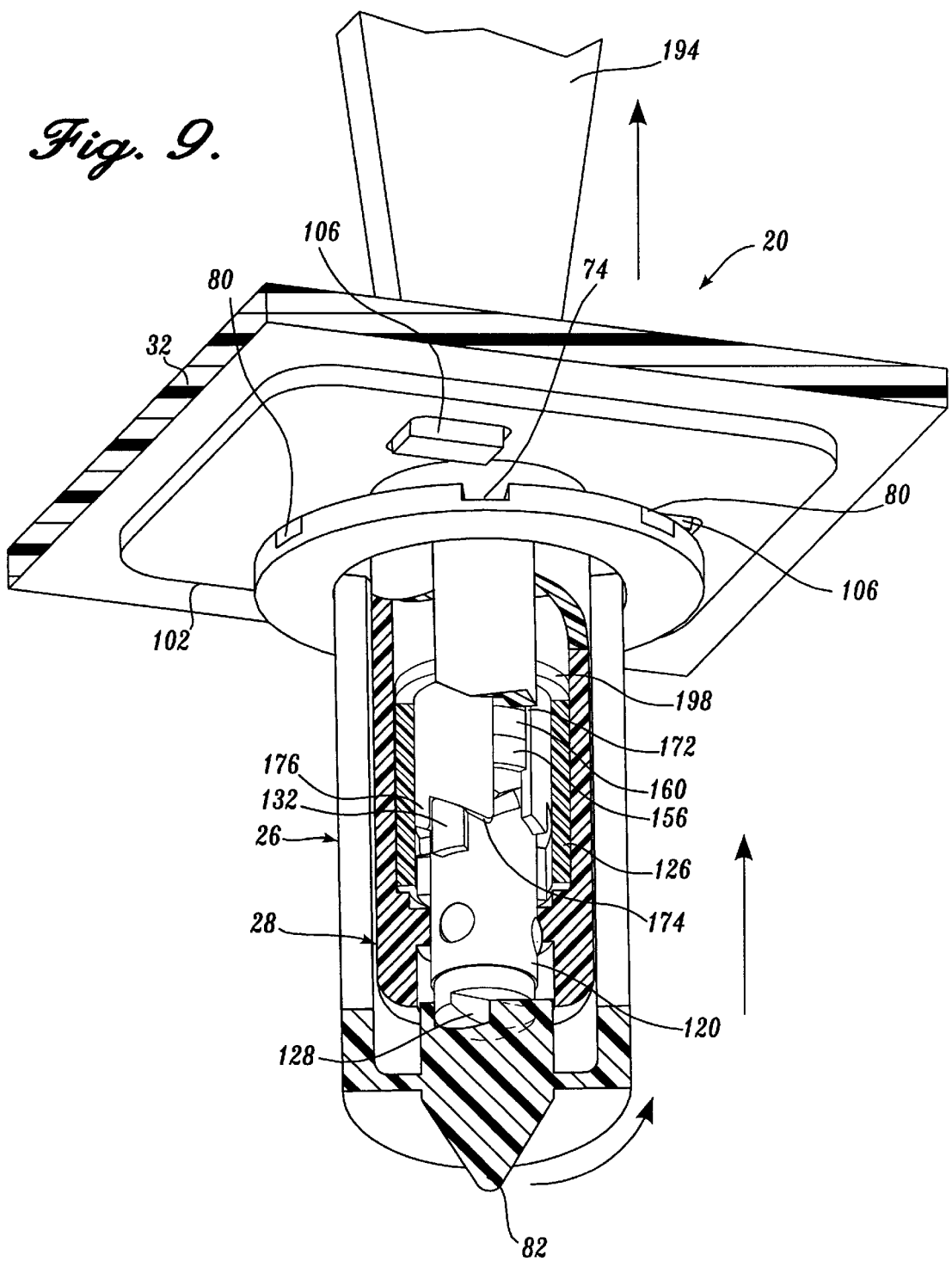
FIG. 9 is a perspective view of a contactless switch formed in accordance with the present invention with the switch housing partially cut away to show the position of the cam assembly when the switch is in the open circuit position.

As seen in FIGS. 8 and 9, the magnets 80 are rotated out of vertical alignment with the Hall effect sensors 106 by this action. The magnets 80 are rotated further out of longitudinal alignment with the Hall effect sensors 106 by the actuator rib 132 sliding down the sloped portion 174 of the projections 170. Because the carousel 26 is keyed to the movement of the actuator 120, both the actuator 120 and the carousel 26 are rotated in a counterclockwise direction. Thus, the carousel spring 86 and cammed surfaces of the cam 122 and actuator 120, as well as the sloped surfaces of the projections 170 and actuator ribs 132, all cooperate to rotate the carousel 26 in predetermined increments.

The carousel 26 and actuator 120 continues its counterclockwise rotation until the actuator rib 132 is seated against the abutment surface 176, thereby producing a tactile response. The tactile response is transmitted through the switch cap 34 to the operator when the actuator rib 132 snaps against the abutment surface 176, indicating that the switch 20 has changed states from the closed circuit to open circuit position. In the open circuit position, the teeth of the corresponding cammed surfaces are once again misaligned in the vertical direction. In particular, as the actuator rib 132 slides down the sloped portion 174, the teeth of the crown cam 130 slide out of complementary alignment with the cam portion 154 of the cam 122. During this movement, the cam 122 and cam spacer 124 slide vertically upward within the channel 172, while the actuator 120 and carousel 26 both translate upwardly and rotate in the counterclockwise direction indicated by the arrow 218 until the actuator rib 132 is seated against the abutment member 176.

Figure 10:
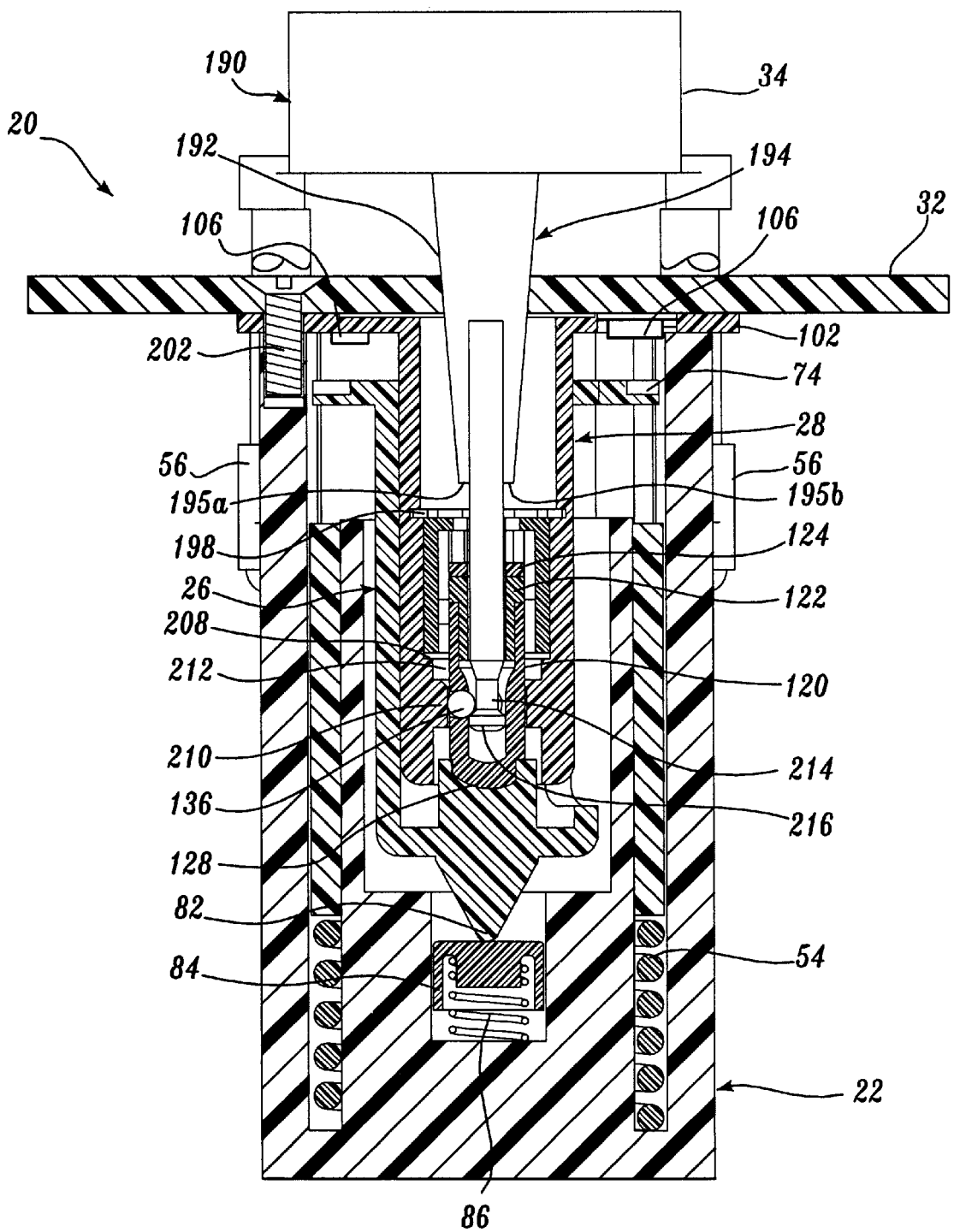
FIG. 10 is a longitudinal cross-sectional view of a contactless switch formed in accordance with the present invention shown in the open circuit position with the switch cap held down.

As may be seen best by referring to FIGS. 9 and 10, the switch 20 is held in the open circuit position by the interference fit of the actuator rib 132 against the abutment surface 176 of the cam guide 126. Vertical movement of the switch cap 34 within the switch housing 22 is limited by the interference of the ball 136 with the pusher 216. As seen in FIG. 10, a portion of the ball 136 is forced into the ball retention groove 214 of the cap assembly 34 by the shoulder 210. As such, the ball 136 is seated against the ball retention groove 214 and the pusher 216 of the switch cap 34, thereby preventing further upward movement of the switch cap 34 within the switch housing 22. Thus, in the open circuit position, the magnets 80 are rotated out of vertical alignment with the Hall effect sensors 106 and the switch 20 is held in this position by both the shoulder 210 and the balls 136.

Figure 11:
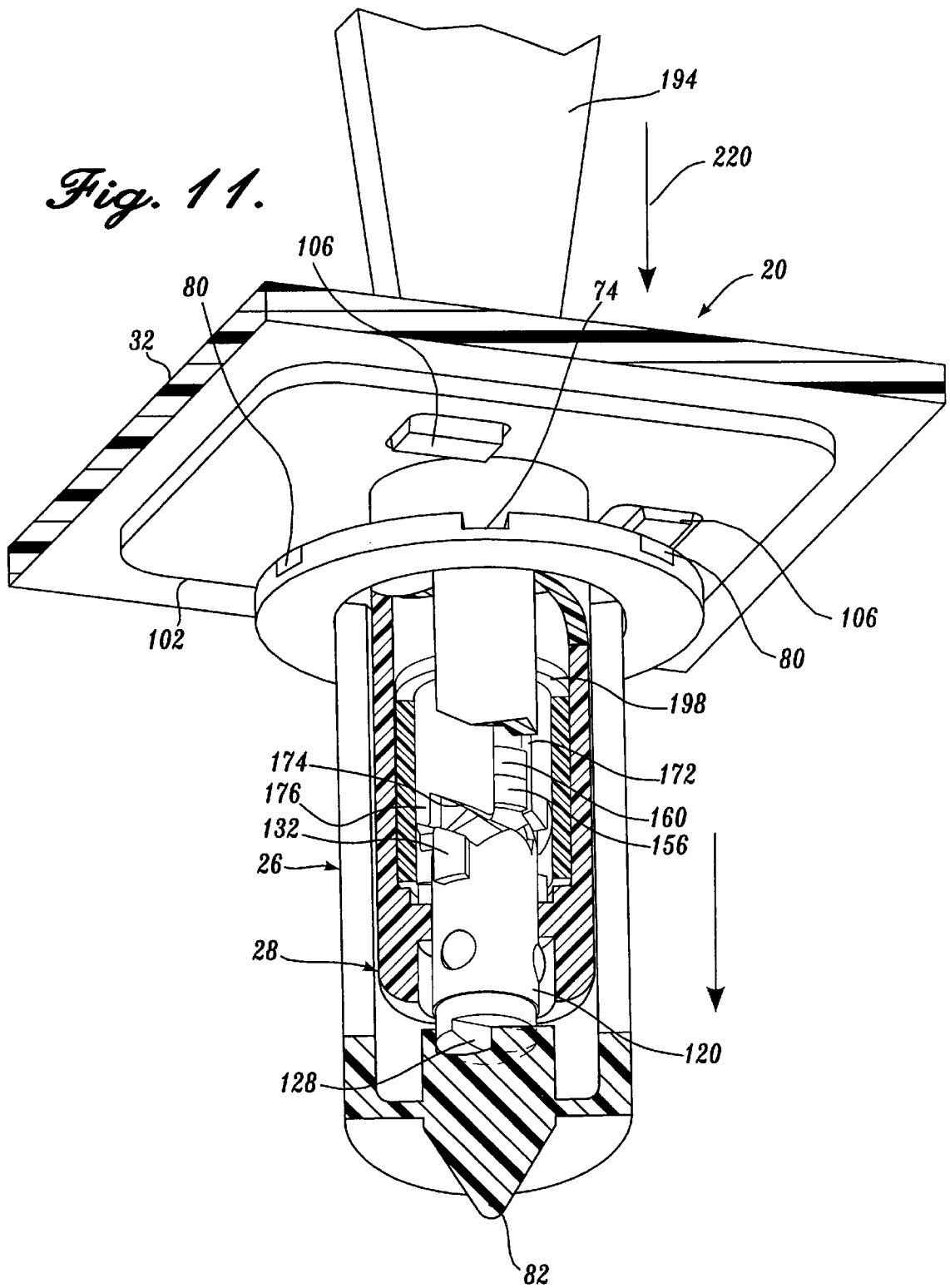
FIG. 11 is a perspective view of a contactless switch formed in accordance with the present invention with the switch housing partially cut away to show the linear motion of the cam assembly as the switch is being actuated from the open circuit to closed circuit position.
Figure 12:
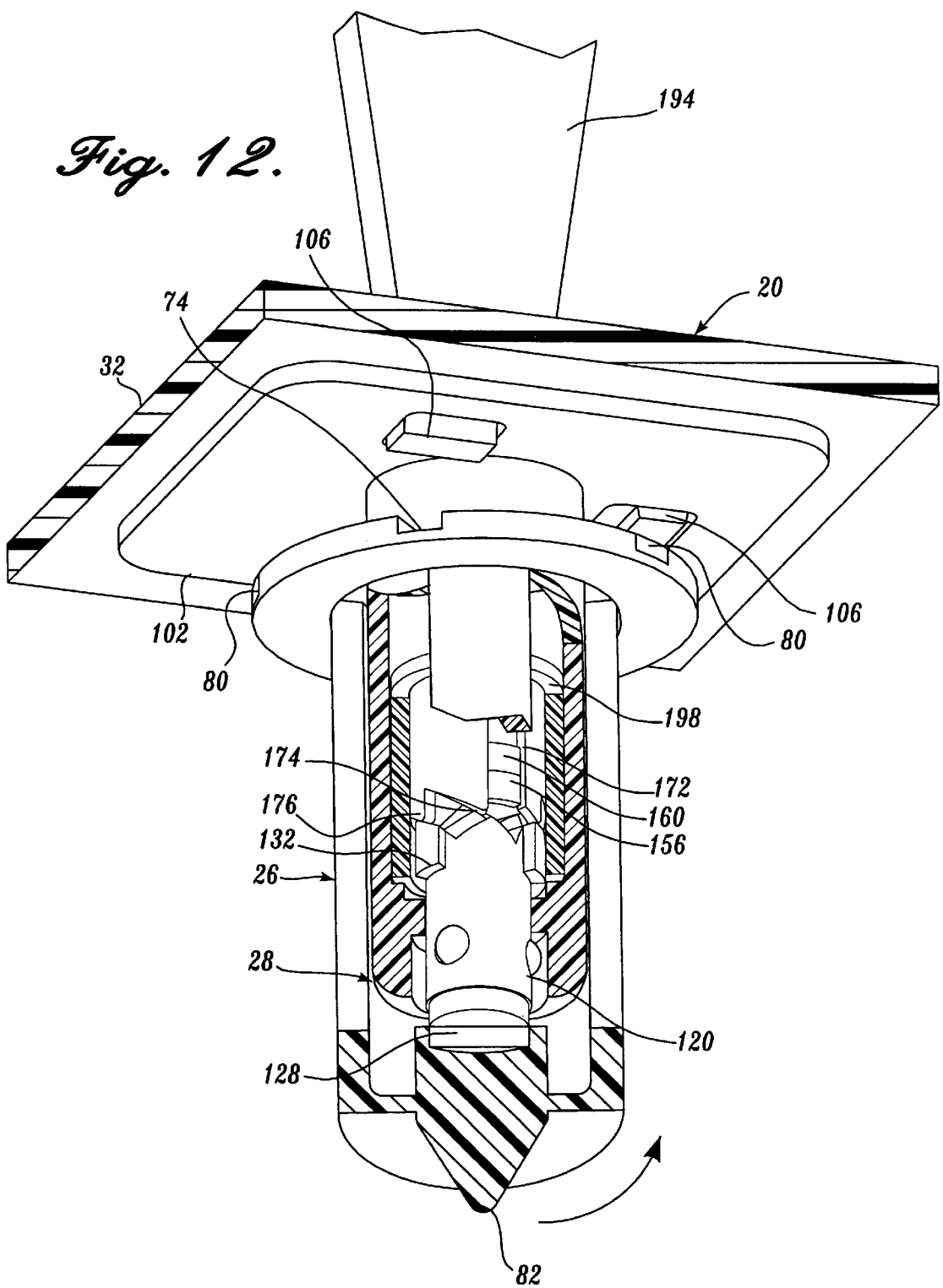
FIG. 12 is a perspective view of a contactless switch formed in accordance with the present invention with the switch housing partially cut away to show the rotary motion of the cam assembly as it is being actuated into the closed circuit position.

Unlocking the switch 20 of the present invention from the open to closed circuit position may be best understood by referring to FIGS. 11–13. In FIG. 11, a pressure is applied to the switch cap 34 in the downward direction, indicated by the arrow 220, causing the ribs 195a and 195b to engage the upper surface of the cam spacer 124 (FIG. 6). As the downward pressure is continually applied to the switch cap 34, the engagement of the ribs 195a and 195b against the cam spacer 124 causes the cam assembly 30 to slide downwardly within the housing 22, against the carousel spring 86. As the cam assembly 30 slides downwardly within the inner housing 28, the actuator rib 132 slides vertically downwards along the abutment surface 176. During this motion, rotation of the actuator 120 and, therefore, the carousel 26 is prevented by the interference between the abutment surface 176 and the actuator rib 132. As seen in FIG. 12, when the switch cap 34 reaches the bottom of its stroke, the upward pressure by the carousel spring 86 initiates the counterclockwise rotation of the actuator 120 and carousel 26 within the inner housing 28, such that the teeth of the corresponding cam sections are again in complementary alignment.

In this position, the upper end of the actuator rib 132 slidably engages the lower end of the abutment surface 176, thereby biasing the actuator rib 132 to slide along the lower end of the abutment surface 176. The carousel spring force and the sloped surfaces of the abutment surface 176 and actuator rib 132 combine to cause the actuator 120 to turn in the counterclockwise direction back into vertical alignment with the cam and cam spacer ribs 156 and 160, as seen in FIG. 13. The upward spring force causes the vertical translation of the actuator 120, cam 122 and cam spacer 124 within the channel 172 and back into the closed circuit position, wherein the magnets 80 are again aligned in the vertical direction and in close proximity with the Hall effect sensors 106.

The previously described version of the present invention provides several advantages over contactless switches currently available in the art. First, the linear-to-rotary motion of the cam assembly integrates the tactile response mechanism with the mechanism for actuating the magnets into and out of close proximity with the Hall effect sensors. This results in a more reliable switch because it has fewer parts than currently available switches. Such a switch has a longer useful life than contact switches currently available because there is no physical contact between the switch components. Furthermore, a contactless switch formed in accordance with the present invention is also cheaper to manufacture because of the lower part count. Integration of the primary rotating cam assembly with the primary rotating Hall switch assembly provides improved smoothness of operation compared to products that rely on an increased amount of sliding motion. Thus, a contactless switch formed in accordance with the present invention is economical to produce, has a high switching action reliability and produces customary and anticipated tactile response while changing the state of the switch.

From the foregoing description, it can be seen that a contactless switch formed in accordance with the present invention incorporates many novel features and offers significant advantages over currently available contactless switches. While the presently preferred embodiments of the invention have been illustrated and described, it is to be understood that within the scope of the appended claims, various changes can be made therein without the departing from the spirit of the invention.

The embodiments of the invention in which an exclusive property or privilege is claimed are defined as follows:

1. A contactless switch, the switch being actuatable between an open circuit position and a closed circuit position, the switch comprising:

(a) a housing;

(b) a linear actuator disposed within the housing;

(c) a linear-to-rotary motion assembly disposed within the housing, the linear-to-rotary motion assembly being coupled to the linear actuator for producing rotary motion of the linear-to-rotary motion assembly in response to a linear displacement of the linear-to-rotary motion assembly by the linear actuator; and (d) a plurality of proximity sensors and magnets, the sensors being disposed within the housing, the magnets being disposed on the linear-to-rotary motion assembly, the magnets being rotated into and out of close proximity with the sensors by the linear-to-rotary motion assembly when the switch is actuated by applying a force to the linear actuator that causes the linear displacement of the linear-to-rotary motion assembly.

2. The contactless switch of claim 1, further comprising a first biasing member disposed within the housing and coupled to the linear-to-rotary motion assembly to drive rotation of the linear rotary to motion assembly and bias the switch into the closed circuit position.

3. The contactless switch of claim 2, further comprising a tactile response mechanism formed with the linear-to-rotary motion assembly to produce a tactile response when the contactless switch is actuated between the open and closed circuit positions.

4. The contactless switch of claim 3, further comprising a hold down mechanism disposed within the housing to selectively lock the switch into the open circuit position.

5. The contactless switch of claim 4, wherein the proximity sensors are Hall effect sensors.

6. The contactless switch of claim 3, wherein said plurality of magnets are arranged in an arcuate array about the linear-to-rotary motion assembly.

7. The contactless switch of claim 3, wherein the linear-to-rotary motion assembly rotates only in one direction within the housing.

8. The contactless switch of claim 3, wherein the linear actuator is a cam assembly.

9. The contactless switch of claim 8, wherein the linear-to-rotary motion assembly comprises a carousel.

10. A contactless switch, the switch actuatable between an open circuit position and a closed circuit position, the switch comprising:

(a) a housing;

(b) a linear-to-rotary motion assembly disposed within the housing for producing a rotary motion in response to a linear displacement of the linear-to-rotary motion assembly;

(c) a plurality of proximity sensors fixed within the housing; and (d) a plurality of magnets disposed on the linear-to-rotary motion assembly, the magnets being rotated into and out of close proximity to the sensors by the linear-to-rotary assembly when the switch is actuated by applying a force to the linear-to-rotary motion assembly that causes the linear displacement of the linear-to-rotary motion assembly.

11. The contactless switch of claim 10, further comprising a first biasing member disposed within the housing, the biasing member being coupled to the linear-to-rotary motion assembly to rotate the linear-to-rotary motion assembly and bias the switch into the closed circuit position.

12. The contactless switch of claim 11, further comprising a tactile response mechanism formed with the linear-to-rotary motion assembly to produce a tactile response when the contactless switch is actuated between the open and closed circuit positions.

13. The contactless switch of claim 12, further comprising a linear actuator disposed within the housing, the linear actuator being coupled to the linear-to-rotary motion assembly to apply a force to the linear-to-rotary motion assembly that causes the linear displacement of the linear-to-rotary motion assembly.

14. The contactless switch of claim 12, further comprising a hold down mechanism disposed within the housing to selectively lock the switch into the open circuit position.

15. The contactless switch of claim 13, wherein said plurality of magnets are arranged in an arcuate array about the linear-to-rotary motion assembly.

16. The contactless switch of claim 12, wherein the linear-to-rotary motion assembly comprises a cam assembly and a carousel.

17. The contactless switch of claim 16, wherein the carousel rotates only in one direction within the housing.

18. A contactless switch, the switch being actuatable between an open circuit position and a closed circuit position, the switch comprising:

(a) a housing;

(b) a linear-to-rotary motion assembly disposed within the housing for producing a rotary motion in response to a linear displacement of the linear-to-rotary motion assembly;

(c) a plurality of Hall effect sensors fixed within the housing;

(d) a plurality of magnets disposed on the linear-to-rotary motion assembly, the magnets being rotated into and out of close proximity to the Hall effect sensors by the linear-to-rotary assembly when the switch is actuated by applying a force to the linear-to-rotary motion assembly that causes the linear displacement of the linear-to-rotary motion assembly; and (e) a hold down mechanism disposed within the housing, the hold down mechanism selectively locks the switch into the open circuit position.

19. The contactless switch of claim 18, further comprising a first biasing member disposed within the housing, the biasing member being coupled to the linear-to-rotary motion assembly to rotate the linear-to-rotary motion assembly and bias the switch into the closed circuit position.

20. The contactless switch of claim 19, further comprising a tactile response mechanism formed with the linear-to-rotary motion assembly to produce a tactile response when the contactless switch is actuated between the open and closed circuit positions.

21. The contactless switch of claim 20, further comprising a linear actuator disposed within the housing, the linear actuator being coupled to the linear-to-rotary motion assembly to apply a force to the linear-to-rotary motion assembly that causes the linear displacement of the linear-to-rotary motion assembly.

22. The contactless switch of claim 21, wherein said plurality of magnets are arranged in an arcuate array about the linear-to-rotary motion assembly.

23. A contactless switch, the switch actuatable between an open circuit position and a closed circuit position, the switch comprising:

(a) a housing;

(b) a linear-to-rotary motion assembly disposed within the housing for producing a rotary motion in response to a linear displacement of the linear-to-rotary motion assembly;

(c) a plurality of proximity sensors fixed within the housing;

(d) a plurality of magnets disposed on the linear-to-rotary motion assembly, the magnets being rotated into and out of close proximity to the sensors by the linear-to-rotary assembly when the switch is actuated by applying a force to the linear-to-rotary motion assembly that causes the linear displacement of the linear-to-rotary motion assembly; and (e) a tactile response mechanism formed with the linear-to-rotary motion assembly to produce a tactile response when the contactless switch is actuated between the open and closed circuit positions.

* * * * *